Oct. 6, 1964 H. DIEDRICH 3,152,024

SEMICONDUCTOR DEVICE AND METHOD OF MANUFACTURING

Filed Nov. 9, 1961 2 Sheets-Sheet 1

INVENTOR
HEINZ DIEDRICH
BY
AGENT

Oct. 6, 1964 H. DIEDRICH 3,152,024

SEMICONDUCTOR DEVICE AND METHOD OF MANUFACTURING

Filed Nov. 9, 1961 2 Sheets-Sheet 2

INVENTOR
HEINZ DIEDRICH

BY
AGENT 3,152,024
SEMICONDUCTOR DEVICE AND METHOD OF MANUFACTURING

Heinz Diedrich, Hamburg, Germany, assignor to North American Philips Company, Inc., New York, N.Y., a corporation of Delaware Filed Nov. 9, 1961, Ser. No. 151,256
Claims priority, application Germany Dec. 23, 1960
6 Claims. (Cl. 148—177)

The invention relates to a semiconductor device and to a method of manufacturing a semi-conductor device, in particular a transistor, the semi-conductor body of which is enveloped, at least for an exposed part, by a surface layer having an increased concentration of active centers.

The electrical properties of a semi-conductor arrangement, for example a transistor, are not constant but to a considerable extent dependent on variations of the surroundings, which vary the surface condition of the semi-conductor arrangement. The variation of the surface may even result in the entire impracticability of the semi-conductor arrangement.

Experiments have been performed to reach along different routes a larger stability of the surface or to decrease or eliminate the influences of this surface of a semi-conductor arrangement on its electrical values, namely without deteriorating the favourable properties of the semi-conductor arrangement, for example the amplification factor of a transistor.

One possibility consists in that the surroundings of the transistor are kept constant, for example by a hermetically closed envelope, and accordingly the variations on the surface of the actual semi-conductor arrangement are kept small.

The known methods use a principally different manner in which the surface is coated with a particularly stable layer. For example, a pnp-transistor in which consequently the base consists of n-conductive material, may be stabilized by diffusing a donor material, for example arsenic, from the surface of the base into the base and covering in this manner the surface of the base with a n-conductive layer of a few microns thick, the conductivity of which layer is higher than that of the remaining base material. In this manner, an artificial electrical "surface" is produced below the geometric surface of the base, since the minority carriers in the base, in the present example holes, are repelled by this stronger n-conductive layer and consequently do not reach the actual geometric surface.

Since the recombination velocity of the "holes" with electrons in the surface is particularly high as compared with that in the volume, this recombination velocity in the base to a high extent determines the electric functioning of a transistor, and the surface recombination is very strongly varied by variations of the surface, the electrical properties of the transistors are consequently stabilized, since the electrical "surface" strongly prevents the minority carriers from reaching the geometric surface. It is also known to reach this effect in a similar manner by enveloping the base of, for example, a pnp-transistor by diffusion with a p-conductive layer. The resulting p-n-junction again forms a new stable electrical surface.

The two above methods have the drawback that they deteriorate the desired electrical properties of the transistor. In circumstances, for example in the case of pnp-transistor, the p-conductive layer on the base may even cause a short-circuit between the p-conductive emitter and the p-conductive collector. If the deterioration of the electrical properties of the transistor are kept small, for example by only a small conductivity of the p-layer produced or by applying only an extremely thin layer, so that the surface conductivity is very small, the activity of the electrical "surface" is again decreased all the same by these two measures. The possibility remains to envelop not the whole base with a layer, in the example chosen a p-conductive layer, but to etch away this layer again in the proximity of the emitter and the collector or to provide separate isles instead of a coherent layer. Not counting the technological difficulties, this possibility results in the fact that in this case the whole surface is no longer screened by an electrical "surface."

The same difficulties present themselves if, for example, a pnp-transistor comprises a base which is enveloped with a strong n-conductive layer. In this case the difficulty occurs that the cut-off voltage to be reached between the base and the collector is decreased owing to the higher conductivity of the surface layer.

These difficulties are avoided by a device and a method of manufacturing a semi-conductor arrangement, in particular a transistor, the semi-conductor body of which is enveloped with a surface layer with increased concentration of active centers, by enveloping, according to the invention, the semi-conductor body at least for an exposed part with a layer having an increased density of recombination centers as compared with the interior, which layer, with the exception of the content of recombination centers, consists of the same material as the interior of the semi-conductor body, while from the surface of the semi-conductor body, substances are diffused which produce recombination centers in the material of the semi-conductor body.

As is known, for producing the desired conductivity type, substances are incorporated in the semi-conductor crystal which produce impurity centers in it which act as donors and acceptors. For this purpose are to be considered, for example in the case of germanium and silicon, elements of group III or V of the periodical system of the elements. For example, germanium of the n-conductivity type is manufactured by incorporating, for example, antimony in it as impurity center. These donors and acceptors produce energy levels when incorporated into the semi-conductor, which, in the forbidden energy zone, are situated very close to the conduction band and valence band respectively and which, for example, in the case of germanium, lie within 0.11 ev. and, in the case of silicon, within 0.16 ev. from the bands concerned. As a result of this, these donors and acceptors respectively are substantially entirely ionized already at room temperature and have already delivered their electron to the conduction band or have already taken it up from the valence band and in this manner increased the electron conductivity and hole conductivity respectively.

While in the above known method such donors or acceptors were used for producing a high-doped surface on the base zone, principally different substances are used in the present invention which produce recombination centers in the semi-conductor. As is known, such recombination centers have the property of strongly increasing the recombination velocity in the semi-conductor material and in this manner strongly decrease the life of the charge carriers in the semi-conductor while on these centers or by means of these centers the minority carriers recombine with majority carriers. The substances which produce recombination centers to be used according to the invention may also be distinguished from the substances normally used as donors and acceptors in that they produce one or several energy levels on incorporation in the semi-conductor material which levels, in the forbidden energy zone, are separated from the conduction band and from the valence band by more than 15% of the width of the forbidden energy zone, that is to say in the case of germanium by more than 0.11 ev. and in the case of silicon by more than approximately 0.17 ev., in which these substances may also produce energy levels which are situated nearer to the conduction band or valence band.

In the case of germanium and silicon, gold, copper, nickel, and iron are to be considered, for example, as substances for producing recombination centers. For example, the incorporation of only $10^{13}$ atoms per $cm.^3$ of nickel produces in germanium an increase of the recombination velocity as compared with that in the same semi-conductor not doped with these centers of a hundred-fold substantially without varying the conductivity.

Naturally, the invention is not restricted to the semi-conductor materials germanium and silicon, but may be applied with the same advantages to other semi-conductor substances, such, for example, as semi-conductive compounds.

The operation of a semi-conductor arrangement manufactured according to the invention will described with reference o the example of a pnp-germanium transistor manufactured according to the normal alloying technology in which it is noted that the method according to the invention is not restricted to transistor and not to semi-conductor arrangements consisting of germanium or silicon.

Figure 3:
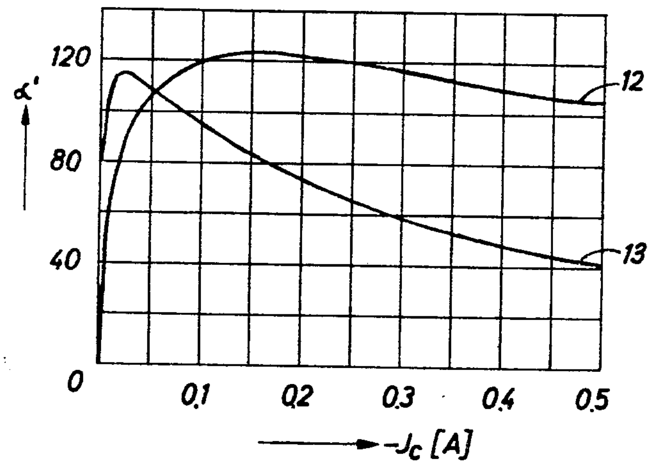

FIG. 3 serves to illustrate the improved operation of the transistor manufacture by the method according to the invention.

Figure 1:
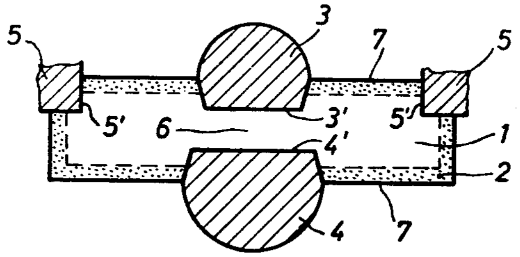
FIGURE 1 shows a strongly enlarged diagrammatic cross-section of a transistor not drawn to scale.

FIGURE 1 shows a strongly enlarged diagrammatic cross-section not drawn to scale, through a transistor manufactured by the method according to the invention, for example a pnp-germanium transistor manufactured according to the normal alloying technology. The semi-conductor body 1 is a disc consisting of single crystalline germanium of the n-type. This disc is enveloped with a layer 2 (exposed to the surroundings) having an increased density of recombination centers as compared with the interior of the semi-conductor body. The method of producing this layer will be described below.

The electrodes of the transistor, the emitter electrode 3 and the collector electrode 4, both of the p-type, as well as the ohmic base electrode 5, are produced by the known alloying technology. The alloying depth of these three electrodes is large so that the alloying fronts 3′, 4′ and 5′ extend through the layer 2 with the increased density of recombination centers, so that no material with increased density of recombination centers is present in the area 6 between the emitter and the collector or in the base.

If a bias voltage is applied in the forward direction at the emitter pn-junction, charge carriers, in the present example "holes," are injected from the emitter 3 into the semi-conductor body 1 forming the base. The injected holes for the greater part travel through the base space of the transistor to the collector 4 biassed in the cut-off direction.

Part of the charge carriers injected into the base space, which part is of importance for the amplification properties of the transistor, diffuses in accordance with the concentration gradient into the direction of the surface 7 of the semi-conductor 1. This component current of the injected charge carriers, so of the minority charge carriers, diffusing the direction of the surface considerably contributes to the base current by recombination with the majority charge carriers, in the example electrons, but without being capable of serving for the amplification, since for the amplification only that part of the minority charge carriers contributes which reaches the collector. The concentration gradient which determines the diffusion velocity to the surface, depends on the fact how rapidly the minority carriers are destroyed on the surface by recombination. It will be understood that variations of the recombination properties of the surface influence the part of the minority carirers current recombining in the base and the total current of these charge carriers and consequently the amplification.

The component current diffusing in the direction of the surface is caused to recombine with increased recombination rate in the layer 2 manufacture by the method according to the invention.

Since the minority carriers recombine for the greater part in the layer 2, they can no longer reach for the greater part the geometric surface 7, as would be possible without the presence of this layer, to be destroyed there owing to the high recombination velocity prevailing at this surface. Since the recombination rate of the layer 2 is based upon the action of recombination centers bound energetically very strongly in the crystal structure of the semi-conductor body 1, the charge carrier current produced by the recombination in the layer 2 timewise is constant to a far higher extent than the current produced by recombination at the surface without the presence of this layer.

It is essential for performing the method according to the invention that the pn-junction of the emitter and collector is situated so deeply in the semi-conductor body 1, that the layer 2 with increased recombination velocity does not extend into the area 6 of the base zone between the emitter and the collector. If this were the case, the minority carriers injected by the emitter into the base zone and travelling to the collector would recombine to a considerable extent and in this manner the current amplification of the transistor would be strongly decreased.

Also the thickness of the layer 2 and its content of recombination centers is to be limited in performing the method according to the invention. For it is known that the current of a pn-junction biassed electrically in the cut-off direction may depend upon the density of the recombination centers present at the pn-junction. Such pn-junctions with increased density of recombination centers biassed in the cut-off direction are located in the present example at the contact surface between the collector 4 and the layer 2. If the density of the recombination centers at the pn-junction is very large, the cut-off current may become large so that a semi-conductor arrangement with one or more of such junctions has worse electrical properties than a semi-conductor arrangement in which such junctions with increased density of recombination centers of the junction are not present.

The layer with higher recombination velocity can be produced, for example, by diffusing an element from the surface into the semi-conductor body. As diffusion elements are to be considered those which in known manner result in the formation of recombination centers in semi-conductor materials. The concentration of the diffused elements decreases, according to known laws, in the direction of the surface in the interior of the semi-conductor body. The density of the recombination centers also decreases to the same extent until at a point in the interior of the semi-conductor body its concentration is equal to the concentration of the recombination centers normally present in any semi-conductor material, for example recombination centers produced by lattice defects, which concentration may not be lower than said concentration. At this point in the interior of the semi-conductor body, the action of the layer with increased density of recombination centers substantially discontinues. The distance of this point from the geometric surface is designated as diffusion depth.

Figure 2:
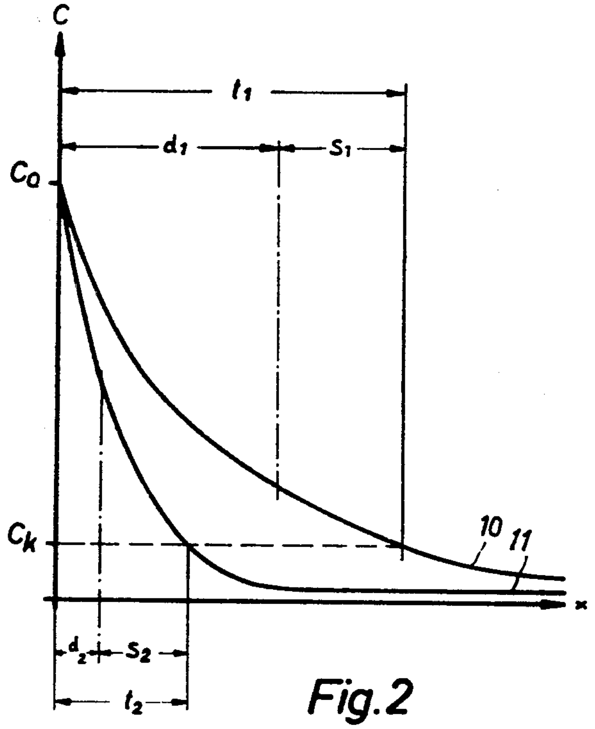
FIGURE 2 illustrates the depth of diffusion.

The concentration of the element to be diffused applied on the surface—the application may be effected, for example, electrolytically—is 100% and consequently determined beforehand in so far as no melting process takes place. If at the diffusing temperature melting of a very thin surface layer takes place, and if such an alloy is formed between the applied element or elements to be diffused and the material of the semi-conductor body, the concentration at the surface is determined by the temperature at which the diffusion is effected. If diffusion is carried out for a long period, a large diffusion depth is obtained with small concentration gradients of the elements diffused. This is shown in curve 10 of FIGURE 2. $C_k$ is the concentration of the recombination centers normally present in a semi-conductor body. $C_o$ is the concentration of the diffused element at the surface. X is a co-ordinate extending from the surface into the semi-conductor body. In accordance with the above $t_1$ is the diffusion depth. By abrasion of the surface, for example by mechanical treatment or etching, a layer of the thickness $d_1$ which can very accurately be determined may be removed after the diffusion process so that as a layer with increased density of recombination centers on the semi-conductor body only the area $s_1$ remains. The layer thickness $s_1$ may have any value between $o$ and $t_1$. In this manner a surface layer of the thickness $s_1$ is obtained with small concentration of recombination centers. If the diffusion time is chosen short, curve 2 of FIGURE 2, it may be seen that in this case a layer of the thickness $s_2$ is obtained with comparatively larger density of recombination centers. Diffusion depth and thickness of the layer removed are in this case $t_2$ and $d_2$ respectively.

So it is possible by the combination of the duration and the temperature of the diffusion process, as well as an abrasion process, to produce the surface layer with a thickness and a density of recombination centers which can be determined at will within wide limits.

The method of producing semi-conductor arrangements according to the invention, the operation of which was described above, will now be described more fully with reference to a few examples.

*Example 1*

A single crystalline plate of germanium of the n-type, 2 ohms/cm. (111)-orientated, 2.4 x 2.4 mm.$^2$, lapped at 200$\mu$ thickness, is covered electrolytically with a layer of gold of 1–3$\mu$ thick and heated between $Al_2O_3$-powder under nitrogen-hydrogen atmosphere for one hour at about 735° C. During the heating process, starting at approximately 370° C., a Au-Ge-melt is formed on the surface of the germanium crystal, which melt serves as gold source for the diffusion when applying the final temperature. The diffused gold atoms work as recombination centers. The diffusion depth is approximately 50$\mu$. The $Al_2O_3$ powder prevents an alloying of the germanium plate with other plates which are treated in the same diffusion process in the same manner. After cooling the germanium plate, the $Al_2O_3$ powder is removed and the plate is treated in the etching solution known under the name of Superoxol. The thickness of the plate decreases to 145$\mu$. The remaining layer with increased recombination rate is 22.5$\mu$ thick on both sides of the plate. The concentration of the recombination centers only amounts to approximately $10^{16}$cm.$^{-3}$ at the surface newly formed after etching. The plate of 145$\mu$ thick is now processed to a pnp-transistor in the known normal alloying technology and secured to electrical connections. The alloying depth of the two p-type areas is larger than 30$\mu$. After mounting, the semi-conductor arrangement is etched electrically in known manner in dilute potassium hydroxide solution. Another 4$\mu$ of the Au-diffusion layer available is removed on either side. The semi-conductor arrangement is dried and enclosed in a housing.

*Example 2*

On a single crystalline germanium disk of the n-type, 7 ohms/cm., (111)-orientated, diameter 20 cm. round, lapped to 300$\mu$ thick, a layer of pure iron of 0.5$\mu$ thick, is deposited from vapour in a vacuum apparatus in a vacuum of more than $10^{-5}$ torr. After depositing the iron from vapour, the germanium disk is heated in a graphite boat for one minute at 700° C. to diffuse the iron. The germanium disk is then lapped on the diffusion side until a thickness of the disk of 200$\mu$ is reached. In this manner, a considerable part of the layer with increased density of iron atoms, which operate as recombination centers, are removed. The germanium disk is then divided into square plates of 2 mm. side length for example by sawing. The individual plates are given a thickness of 145$\mu$ by chemically etching in Superoxol and processed to pnp-transistors according to known alloying technology.

*Example 3*

A single crystalline plate of silicon of the p-type, 10 ohms/cm., (111)-orientated, 400$\mu$ thick, is dipped in an aqueous solution of mangenese salt, taken out of it and dried and then heated in a furance under normal atmosphere at 1000° C. for 10 minutes, then lapped on either side to 200$\mu$ thick. Then a npn-transistor is manufactured from the plate as basic body in known alloying technology.

The semi-conductor arrangements manufactured by the method according to the invention have an improvement of the stability of the electrical properties. In addition, they have a favourable variation of the normally defined current amplification factor $\alpha'$ at increasing collector current. As is known, the current amplification factor $\alpha'$ of transistors with increasing collector current decreases considerably after reaching a maximum, which often means a decisive limit of the usability of the transistor in the range of higher powers. Curves 12 and 13 of FIGURE 3 show the variation of $\alpha'$ with increasing collector current. The curve 12 shows the variation of $\alpha'$ in a transistor manufactured by the method according to the invention, the geometry of which corresponds to that of the normal transistor used for the comparison curve 13. The favourable variation may be seen, the decrease of the curve 12 after the maximum with increasing collector current is smaller than that of curve 13. The maximum reaches approximately the same value in both curves.

What is claimed is:

1. A semiconductor device comprising a semiconductive body having exposed surface portions, a surface layer of said body at least at said exposed surface portions containing a concentration of recombination centers greater than the concentration present in interior portions of the body but being otherwise of substantially the same composition as that of the said interior portions, and at least one electrode alloyed to the body and penetrating through the said surface layer with increased recombination centers, whereby said device exhibits electrical properties less subject to influence from surface effects.

2. A device as set forth in claim 1 wherein the said surface layer contains an increased concentration of atoms of an element selected from the group consisting of gold, copper, nickel and iron.

3. A transistor device comprising a semiconductive body having exposed surface portions, a surface layer of said body at least at said exposed surface portions containing a concentration of recombination centers greater than the concentration present in interior portions of the body but being otherwise of substantially the same composition as that of the said interior portions, and a pair of electrodes alloyed to the body and penetrating through the said surface layer with increased recombination centers and producing at the interior of said body a pair of spaced rectifying junctions, whereby said device exhibits electrical properties less subject to influence from surface effects.

4. A method of manufacturing a semiconductor device, comprising providing a semiconductive body with a substantially homogeneous distribution of recombination centers, diffusing into the surface of the body, over at least a major fraction of the surface of said body, a recombination-center-producing substance to form on the body surface layers containing an increased concentration of recombination centers relative to the body interior, and thereafter alloying at least one electrode into the body to penetrate through the said surface layer with increased concentration of recombination centers and form a rectifying junction at an interior portion of the body.

5. A method as set forth in claim 4 wherein the substance is selected from the group consisting of gold, copper, nickel and iron.

6. A method of manufacturing a semiconductor device, comprising providing a semiconductive body with a substantially homogeneous distribution of recombination centers, providing on the surface of the body, over at least a major fraction of the surface of said body, a recombination-center-producing substance, diffusing said substance into the body to form on the body surface layers containing an increased concentration of recombination centers relative to the body interior, thereafter removing the substance and a portion only of the thus-formed surface layers to a preselected depth leaving at the surface of the body a predetermined increased concentration of recombination centers, and thereafter alloying electrodes into the body to penetrate through the said remaining surface layers of increased concentration of recombination centers and form a pair of rectifying junctions at interior portions of the body.

References Cited in the file of this patent

UNITED STATES PATENTS 2,784,121 Fuller ---------------- Mar. 5, 1957